United States Patent
Sato

(10) Patent No.: US 7,494,869 B2
(45) Date of Patent: Feb. 24, 2009

(54) SEMICONDUCTOR INTEGRATED CIRCUIT DEVICE AND MANUFACTURING METHOD THEREOF

(75) Inventor: Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 11/338,707

(22) Filed: Jan. 25, 2006

(65) Prior Publication Data

US 2006/0258092 A1   Nov. 16, 2006

(30) Foreign Application Priority Data

May 13, 2005  (JP)  ............................. 2005-141573

(51) Int. Cl.
*H01L 21/336* (2006.01)
(52) U.S. Cl. .................. 438/257; 438/264; 438/593; 257/E21.422
(58) Field of Classification Search .................. 438/257, 438/264, 261, 593, 594
See application file for complete search history.

(56) References Cited

U.S. PATENT DOCUMENTS

| | | | | |
|---|---|---|---|---|
| 6,222,225 B1 * | 4/2001 | Nakamura et al. | ........... | 257/315 |
| 6,838,342 B1 * | 1/2005 | Ding | ........................... | 438/257 |
| 6,933,194 B2 * | 8/2005 | Narita et al. | ................. | 438/257 |
| 7,015,099 B2 * | 3/2006 | Kim et al. | .................... | 438/257 |
| 7,115,940 B2 * | 10/2006 | Sumino et al. | ............... | 257/315 |
| 7,256,091 B2 * | 8/2007 | Kim et al. | .................... | 438/264 |

FOREIGN PATENT DOCUMENTS

| JP | 2001-284556 | | 10/2001 |
|---|---|---|---|
| JP | 2004-22819 | * | 1/2004 |

* cited by examiner

*Primary Examiner*—Michael Trinh
(74) *Attorney, Agent, or Firm*—Oblon, Spivak, McClelland, Maier & Neustadt, P.C.

(57) ABSTRACT

A manufacturing method of a semiconductor integrated circuit device is disclosed. A gate insulating film is formed on a semiconductor substrate. A first film used as floating gates is formed on the gate insulating film. Trenches are formed in the substrate through the first film. Insulating materials are embedded in the trenches. The insulating materials are set back at least in a plane direction. Second films used as floating gates are formed between the side walls of the insulating materials without making directly contact with the side walls of the insulating materials. The insulating materials are set back from spaces caused between the insulating materials and the second films.

7 Claims, 7 Drawing Sheets

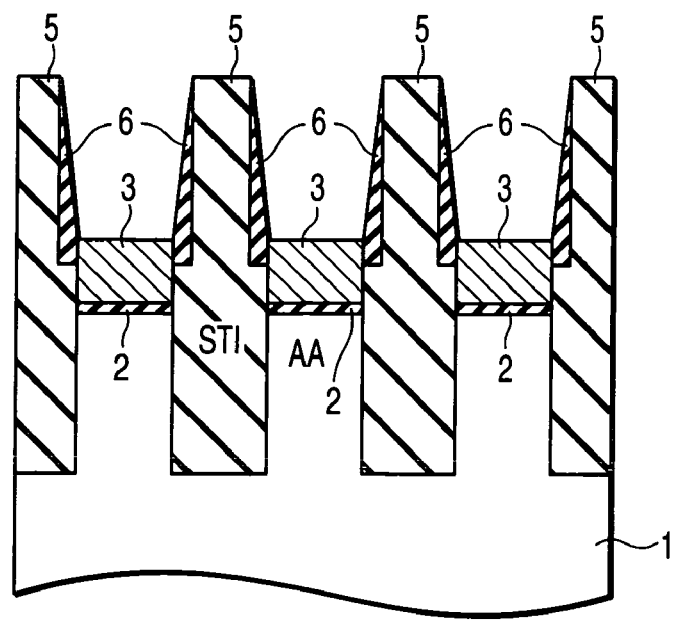
F I G. 3
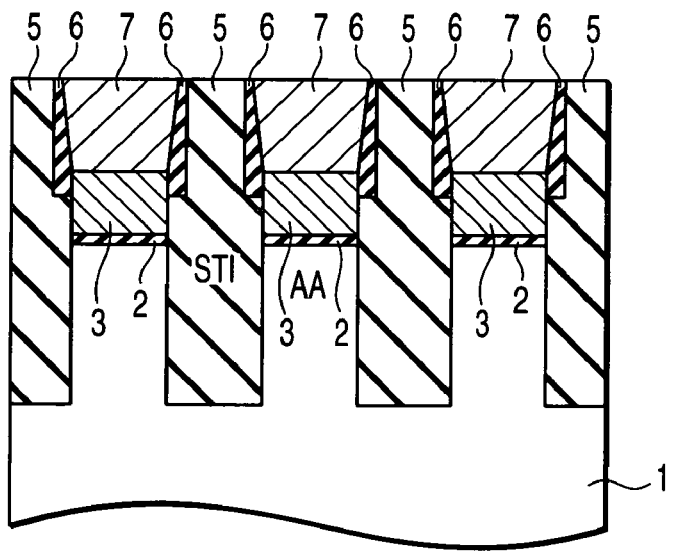
F I G. 4

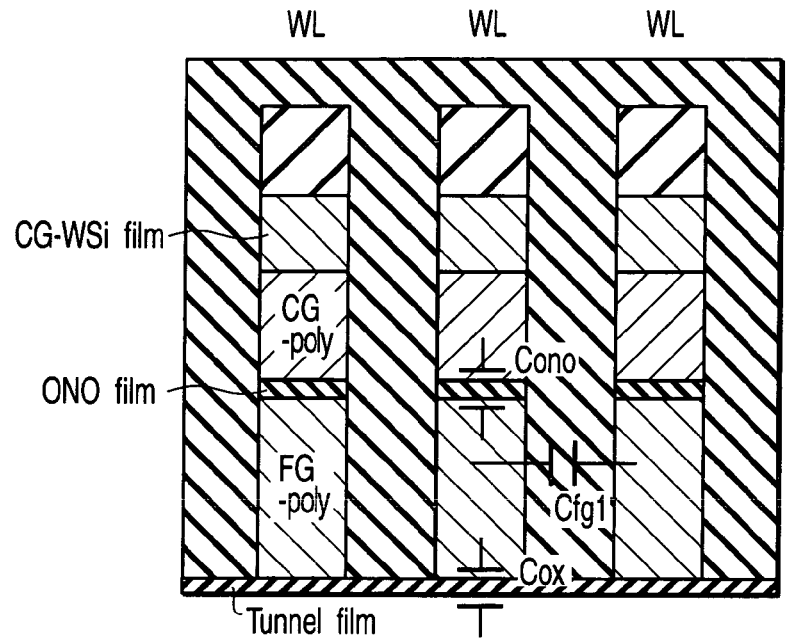
FIG. 8A  NAND flash cell structure (WL cross section)
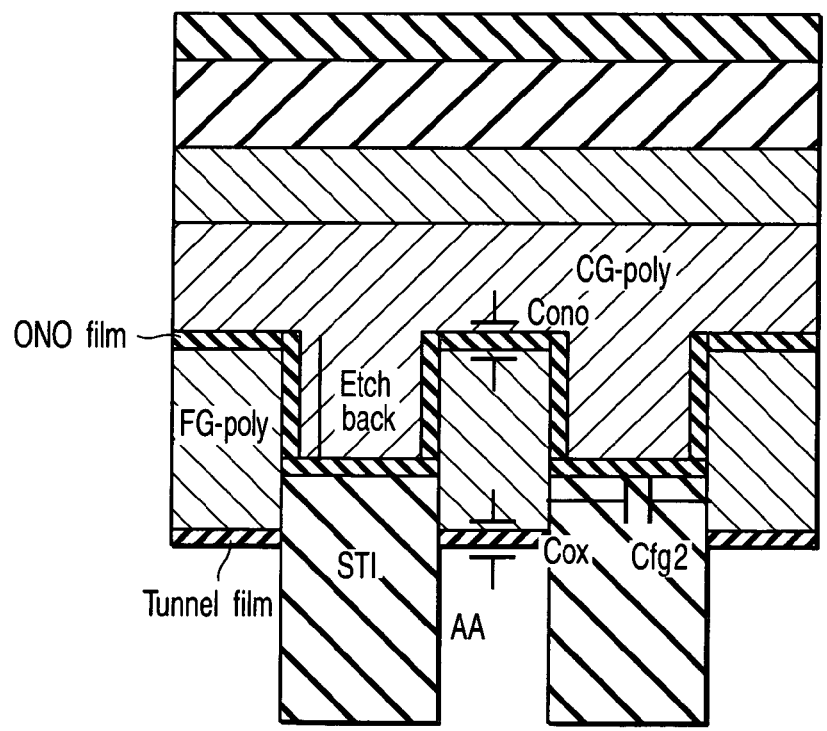
FIG. 8B  NAND flash cell structure (BL cross section)

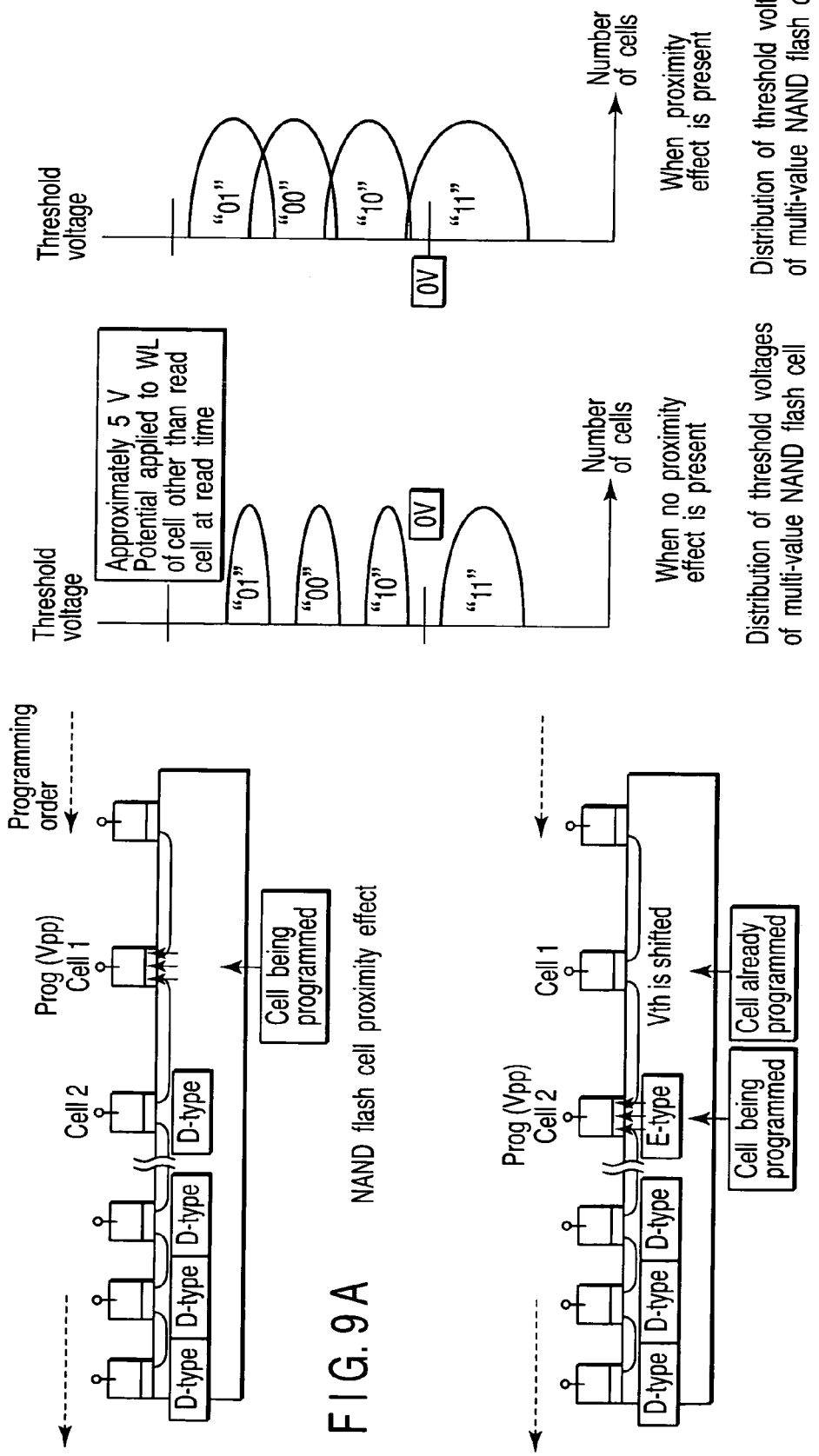

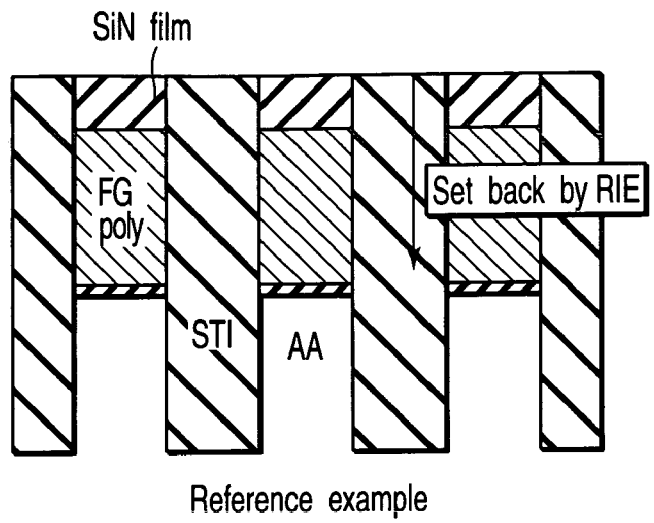
FIG. 10A   Reference example
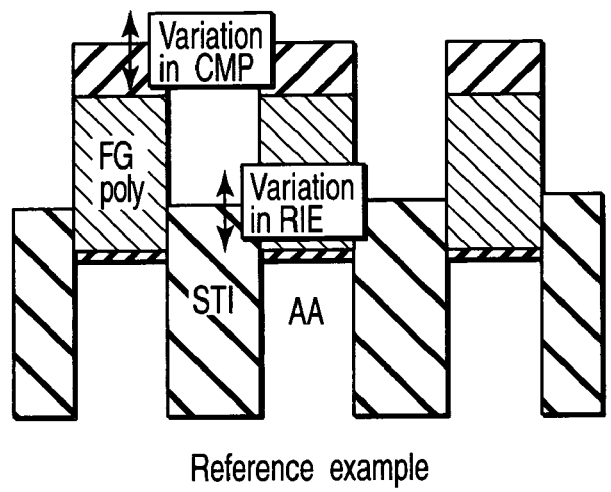
FIG. 10B   Reference example
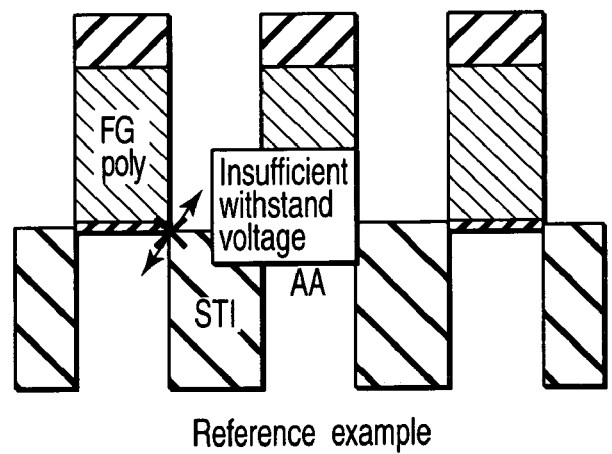
FIG. 10C   Reference example

SEMICONDUCTOR INTEGRATED CIRCUIT DEVICE AND MANUFACTURING METHOD THEREOF

CROSS-REFERENCE TO RELATED APPLICATIONS

This application is based upon and claims the benefit of priority from prior Japanese Patent Application No. 2005-141573, filed May 13, 2005, the entire contents of which are incorporated herein by reference.

BACKGROUND OF THE INVENTION

1. Field of the Invention

This invention relates to a semiconductor integrated circuit device and, more particularly, to a semiconductor integrated circuit device having an electrically rewritable nonvolatile semiconductor memory, and a manufacturing method thereof.

2. Description of the Related Art

In an electrically rewritable nonvolatile semiconductor memory device such as a NAND flash memory, a variation in the programming speed caused by a variation in the coupling ratio becomes a problem. Particularly, the problem becomes significant in a multi-value flash memory. The coupling ratio is expressed as follows and is strongly dependent on Cono:

$$Cp=Cono/(Cono+Cox),$$

where Cono indicates the capacitance between the control gate and the floating gate.

A typical manufacturing method of a NAND flash memory is described in FIGS. 18(a) to (d) of Jpn. Pat. Appln. KOKAI Publication No. 2001-284556, for example.

BRIEF SUMMARY OF THE INVENTION

A manufacturing method of a semiconductor integrated circuit device according to a first aspect of the present invention comprises forming a gate insulating film on a semiconductor substrate, forming a first film used as floating gates on the gate insulating film, forming trenches in the substrate through the first film, embedding insulating materials in the trenches, setting back the insulating materials at least in a plane direction, forming second films used as floating gates between side walls of the insulating materials without making directly contact with the side walls of the insulating materials, and setting back the insulating materials from spaces formed between the insulating materials and the second films.

A semiconductor integrated circuit device according to a second aspect of the present invention comprises active areas isolated by insulating materials, and floating gates which are formed on and insulated from the active areas and whose side surfaces are sandwiched between the insulating materials, wherein the floating gate has a laminated structure of first and second films and at least part of a cross section of the floating gate along a word line has a reversed trapezoid form.

BRIEF DESCRIPTION OF THE SEVERAL VIEWS OF THE DRAWING

FIG. 3 is a cross-sectional view showing one manufacturing step of the semiconductor integrated circuit device according to one embodiment of this invention;

FIG. 4 is a cross-sectional view showing one manufacturing step of the semiconductor integrated circuit device according to one embodiment of this invention;

FIG. 8A is a cross-sectional view (WL cross section) showing the NAND flash cell structure;

FIG. 8B is a cross-sectional view (BL cross section) showing the NAND flash cell structure;

FIGS. 9A to 9D are diagrams for illustrating the proximity effect occurring in the NAND flash cell; and FIGS. 10A to 10C are cross-sectional views for illustrating the situation of a semiconductor integrated circuit device according to a reference example.

DETAILED DESCRIPTION OF THE INVENTION

Before explaining an embodiment of this invention, first, a manufacturing method of the present NAND flash memory and the problem thereof are explained.

In the manufacturing method of the present NAND flash memory (reference example), as shown in FIGS. 10A to 10C, shallow trench isolation (STI) films are etched back in order to attain a sufficient amount of Cono. A variation in the etch-back amount (a variation in CMP and a variation in RIE) leads to a variation in Cono.

Recently, in a multi-value flash memory, a variation in the threshold voltage of an adjacent cell caused by the parasitic capacitance attracts much attention as an important factor. The variation in the threshold voltage is called the proximity effect in this specification. The proximity effect is a phenomenon wherein the threshold voltage of a cell which is already programmed varies by causing an adjacent cell to be set into a programmed state or non-programmed state as shown in FIGS. 9A and 9B. In the multi-value flash memory, the threshold voltage distribution is tight as shown in FIGS. 9C and 9D. Therefore, the margin for spread of the distribution by the proximity effect is small. Further, the proximity effect becomes more significant by miniaturization of the cell and this becomes an obstacle to realization of a fine pattern multi-value flash memory.

The structure of the NAND flash cell is shown in FIGS. 8A and 8B. In order to suppress the proximity effect, it is preferable to etch back the STI films as deeply as possible. Then, the value of Cfg2 shown in FIG. 8B becomes smaller. However, if the STI films are deeply etched, the possibility that the etch-back process will proceed to an active area (AA) by a process fluctuation becomes greater as shown in FIG. 10C. This is one reason for poor withstand voltage. Therefore, it is necessary to set a certain margin in the etch-back process of the STI films, and as a result, it becomes impossible to freely decrease the value of Cfg2. This is an obstacle to suppression of the proximity effect.

There will now be described one embodiment of this invention with reference to the accompanying drawings. In this explanation, common reference symbols are given to like portions throughout the drawings.

FIGS. 1 to 7 are cross-sectional views each showing one manufacturing step of a semiconductor integrated circuit device according to one embodiment of this invention. In this example, a NAND flash memory is shown. However, the present embodiment can also be applied to an electrically rewritable nonvolatile semiconductor memory device in addition to the NAND flash memory.

Figure 1:
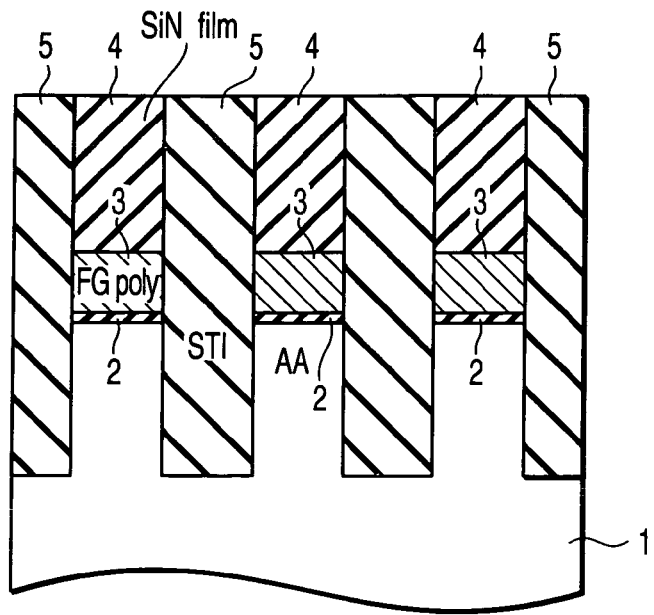
FIG. 1 is a cross-sectional view showing one manufacturing step of a semiconductor integrated circuit device according to one embodiment of this invention.

First, a structure shown in FIG. 1 is obtained by use of a well known manufacturing method. For example, the surface of a P-type silicon substrate (or P-type well) 1 is oxidized to form a silicon dioxide film (tunnel oxide film) 2. Then, conductive polysilicon is deposited on the silicon dioxide film 2 to form a conductive polysilicon film 3. The conductive polysilicon film 3 is used as floating gates later. In this example, the conductive polysilicon film is formed to be relatively thin. Next, silicon nitride is deposited on the conductive polysilicon film 3 to from a silicon nitride (SiN) film 4. In this example, the silicon nitride film 4 is formed relatively thick. Then, an active area (AA) forming process is performed. In this example, the silicon nitride film 4 is used as a mask member when trenches are formed. With the silicon nitride film 4 used as a mask, shallow trenches are formed to pass through the conductive polysilicon film 3 in the substrate 1. Then, insulating materials such as silicon dioxide are embedded in the shallow trenches, for example. Thus, shallow trench isolation (STI) structures 5 are formed to isolate AAs. Floating gates are formed in self-alignment with respect to AAs.

Figure 2:
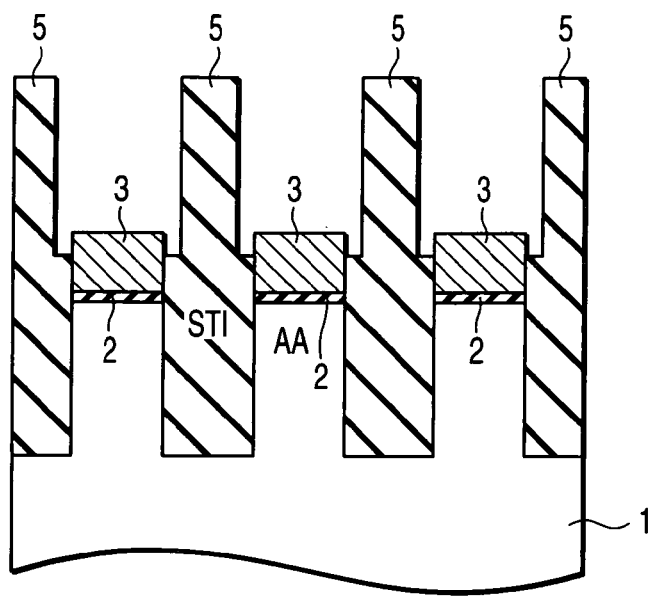
FIG. 2 is a cross-sectional view showing one manufacturing step of the semiconductor integrated circuit device according to one embodiment of this invention.

Next, as shown in FIG. 2, the silicon nitride film 4 is removed by use of hot phosphoric acid. Then, the substrate 1 is subjected to a process using dilute fluoric acid and the STI (silicon dioxide) structures 5 are slightly removed or set back in the depth direction and plane direction. That is, the STI structures 5 are etched by isotropic etching and spaces formed by removing the mask member and each lying on the conductive polysilicon film 3 between the STI structures 5 are enlarged. In this example, the STI structures 5 are set back in the depth direction and plane direction, but the STI structures 5 may be set back at least in the plane direction.

Next, as shown in FIG. 3, silicon nitride is deposited on the surface of the substrate 1 subjected to the process using dilute fluorite acid to form thin silicon nitride films 6. Then, the thin silicon nitride films are subjected to a reactive ion etching (RIE) process to leave the thin silicon nitride films 6 in a spacer form on the side walls of the STI structures 5, for example, on portions set back by the process using dilute fluorite acid.

Next, as shown in FIG. 4, conductive polysilicon is deposited on the structure shown in FIG. 3 to form conductive polysilicon films 7. Then, the conductive polysilicon films 7 are subjected to a chemical mechanical polishing (CMP) process by using the STI structures 5 as polishing stoppers and are made flat. That is, the conductive polysilicon films 7 are embedded between the silicon nitride films 6 of spacer form. The conductive polysilicon films 7 are later used as floating gates together with the conductive polysilicon films 3. In this step, the STI structures 5 and silicon nitride films 6 of spacer form are slightly polished and removed. Then, the surface of each silicon nitride film 6 is exposed between the surface of the STI structure 5 and the surface of the conductive polysilicon films 7. By thus exposing the surfaces of the silicon nitride films 6, an advantage that the silicon nitride films 6 can be easily removed in the next step is attained.

Figure 5:
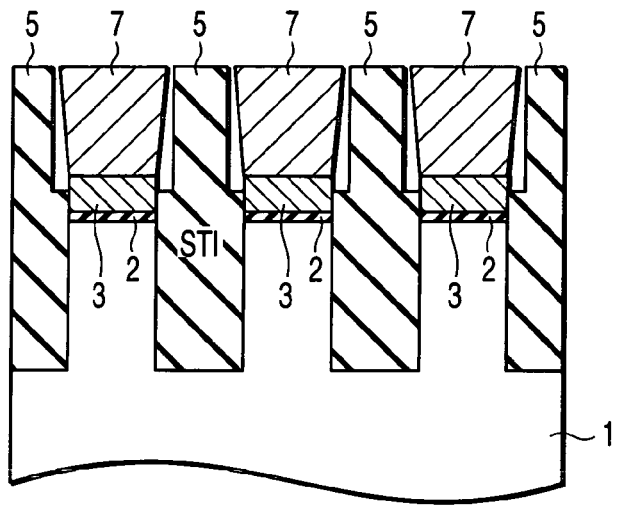
FIG. 5 is a cross-sectional view showing one manufacturing step of the semiconductor integrated circuit device according to one embodiment of this invention.

Next, as shown in FIG. 5, the silicon nitride films 6 are removed by use of hot phosphorus acid to form spaces between the STI structures 5 and the conductive polysilicon films 3, 7. In this example, the spaces are formed between the STI structures 5 and the conductive polysilicon films 3, 7, but the spaces may be formed only between the STI structures 5 and the conductive polysilicon films 7. In short, it is sufficient if the spaces are formed by removing the silicon nitride films 6 to expose the side walls of the STI structures 5.

Figure 6A:
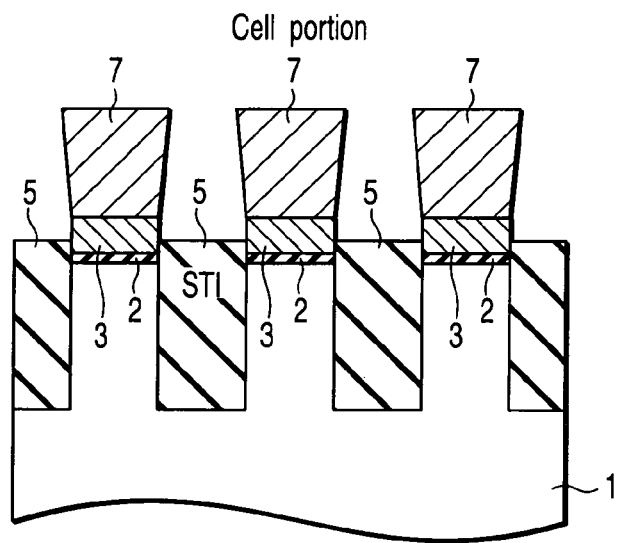
FIGS. 6A and 6B are cross-sectional views each showing one manufacturing step of the semiconductor integrated circuit device according to one embodiment of this invention.
Figure 6B:
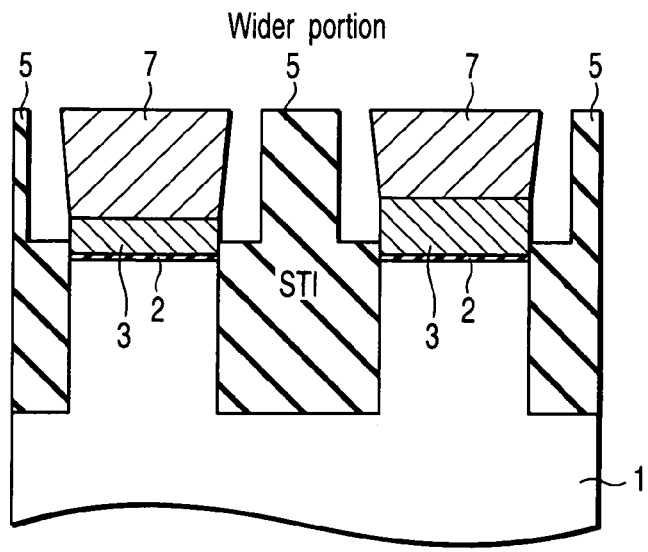

Next, as shown in FIGS. 6A and 6B, the substrate 1 is subjected to the process using dilute fluorite acid to set back the STI structures 5. At this time, the dilute acid reaches not only the upper surfaces of the STI structures 5 but also the side walls of the STI structures 5 via the spaces formed in the step of FIG. 5. That is, the STI structures 5 are set back via the spaces. Thus, the STI structures 5 are etched back. In this example, for example, as shown in FIG. 6A, the STI structure 5 is removed from between the conductive polysilicon films 7 in the cell portion. As shown in FIG. 6B, in a portion in which the width of AA is larger than that in the cell portion, for example, in a peripheral circuit portion, the STI structures 5 are left behind between the conductive polysilicon films 7. The circuit has no problem as an integrated circuit if the STI structures 5 are left behind.

Figure 7A:
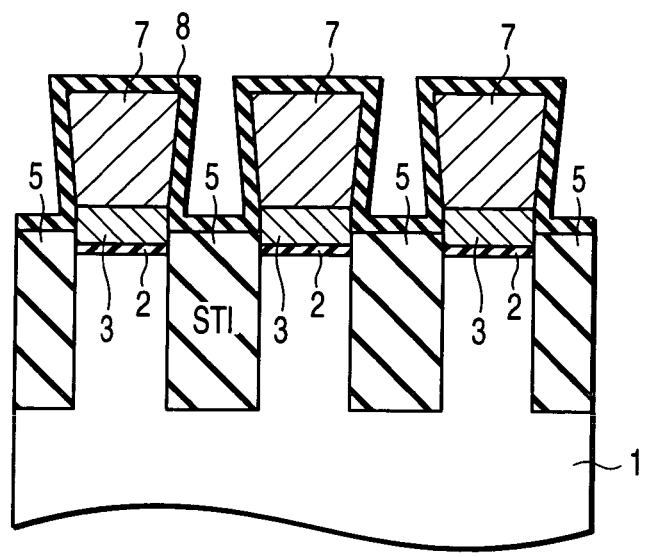
FIGS. 7A and 7B are cross-sectional views each showing one manufacturing step of the semiconductor integrated circuit device according to one embodiment of this invention.
Figure 7B:
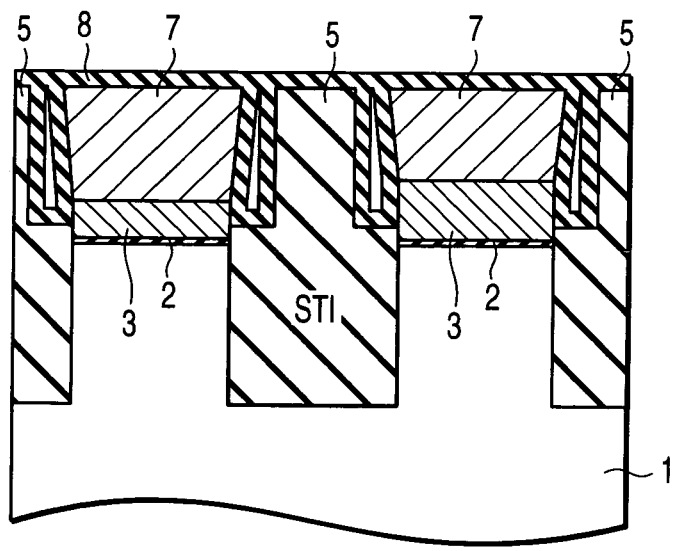

Next, as shown in FIGS. 7A and 7B, an insulating material is deposited on the structure of FIGS. 6A and 6B to form gate-gate insulating films 8. As one example of the gate-gate insulating film 8, a three-layered film of silicon dioxide/silicon nitride/silicon dioxide which is a so-called an ONO film is provided.

After this, particularly, not shown in the drawing, control gates (word lines), source lines, bit lines and the like are sequentially formed by use of a well known manufacturing method to complete the semiconductor integrated circuit device according to one embodiment.

In the semiconductor integrated circuit device according to one embodiment, variation in the etch-back amount of the STI structure becomes smaller in comparison with the reference example shown in FIGS. 10A to 10C. For example, variation in the etch-back amount of the STI structure in the reference example includes a CMP variation and RIE variation. On the other hand, a variation in one embodiment of this invention includes only variations in two etching processes (in this example, the process using dilute fluorine acid). Then, etchant (in this example, dilute fluorine acid) reaches not only the upper surfaces of the STI structures 5 but also the side walls of the STI structures 5 via the spaces formed by removing the spacers (in this example, the silicon nitride films 6). Thus, the etchant reaches both of the upper surface and side walls of the STI structure 5, and as a result, the etching amount of the STI structure 5 can be suppressed. If the etching amount can be suppressed, variation becomes smaller.

Thus, according to one embodiment, a variation in the etching amount of the STI structure 5 can be suppressed in comparison with the reference example. By suppressing the variation in the etching amount, a variation in the coupling ratio becomes small and a variation in the programming speed caused by the variation in the coupling ratio can be made small.

Further, the etch-back margin of the STI structure 5 can be made small in comparison with the reference example and the STI structure 5 can be more deeply etched back in comparison with the reference example. By deeply etching back the STI structure 5, for example, the value of Cfg2 can be made small as shown in FIG. 8B and the proximity effect can be suppressed.

In the semiconductor integrated circuit device according to one embodiment, the floating gate has a laminated structure, for example, a two-layered structure. In this example, the laminated structure is a two-layered structure of the conductive polysilicon films 3 and 7. For example, as shown in FIG.

7A, in the floating gate with the two-layered structure, the width of AA is small and the width of the gate-gate insulating film 8 is large in the cross section along the word line direction. That is, at least part of the cross section of the floating gate along the word line is formed according to the spacer or the surface shape of the silicon nitride film 6 in this example. One example thereof is a reversed trapezoid form. The shape can be attained by forming the silicon nitride film 6 and then removing the same. Therefore, in a flash memory in which the floating gate has a two-layered structure, the width on the AA side is small and the width on the gate-gate insulating film 8 side is large in the cross section in the word line direction, it can be supposed that the same effect as that of the above embodiment can be attained.

In a portion in which the width of AA is larger than that of the cell portion, for example, in a peripheral circuit portion, the STI structures 5 are left behind in the convex form and are not left behind on the cell portion. This structure is obtained by removing the silicon nitride films 6 with an optimum condition set for a portion in which the width of AA is small, that is, for the cell portion. Therefore, for example, in a flash memory in which the upper surface of the STI structure 5 is flat in the cell portion and is convex in the peripheral circuit portion and a flash memory in which the position of the uppermost surface of the STI structure 5 in the cell portion and the position of the lowest surface of the STI structure 5 in the peripheral circuit portion are set at substantially the same level, it can be supposed that substantially the same effect as that of the above embodiment can be attained.

If the position of the uppermost surface of the STI structure 5 in the cell portion lies in the level of the lowest layer of the floating gate of the laminated structure, in this example, in the level of a portion of the conductive polysilicon film 3, the structure can be attained by deeply etching the STI 5. Therefore, with the above flash memory, particularly, the effect of suppressing the proximity effect can be more effectively attained among the effects of the above embodiment.

According to the above embodiment, a semiconductor integrated circuit device having an electrically rewritable nonvolatile semiconductor memory device in which a variation in the programming speed can be suppressed and a control method thereof can be provided.

As described above, this invention is explained by use of one embodiment, but the embodiment of this invention is not limited only to the above embodiment. This invention can be variously modified without departing from the technical scope thereof at the embodying stage.

Further, the above embodiment contains inventions of various stages and inventions of various stages can be extracted by adequately combining a plurality of constituents disclosed in the above embodiment.

The above embodiment is explained based on the example in which this invention is applied to the NAND flash memory. However, this invention is not limited to the NAND flash memory and can be applied to a flash memory other than the NAND memory. For example, this invention can be applied to an AND memory and NOR memory. Further, a semiconductor integrated circuit device containing the above flash memory, for example, a processor or system LSI are also within the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor integrated circuit device comprising:
    forming a gate insulating film on a semiconductor substrate,
    forming a first film used as floating gates on the gate insulating film,
    forming a mask member used when trenches are formed in the substrate on the first film used as the floating gates,
    forming trenches in the substrate through the first film by using the mask member as a mask,
    embedding insulating materials in the trenches,
    removing the mask member and setting back the insulating materials at least in a plane direction,
    forming spacers on side walls of the insulating materials,
    forming second films used as floating gates between the spacers,
    removing the spacers and forming spaces which expose the side walls of the insulating materials, and setting back the insulating materials from the spaces.

2. The method according to claim 1, wherein the second film is formed between the spacers with the upper surfaces of the spacers exposed.

3. The method according to claim 1, wherein the insulating material is set back in a depth direction and the space is formed to extend from a portion between the insulating material and the second film to a portion between the insulating material and the first film.

4. The method according to claim 2, wherein the insulating material is set back in a depth direction and the space is formed to extend from a portion between the insulating material and the second film to a portion between the insulating material and the first film.

5. A manufacturing method of a semiconductor integrated circuit device comprising:
    forming a gate insulating film on a semiconductor substrate,
    forming a first film used as floating gates on the gate insulating film,
    forming trenches in the substrate through the first film,
    embedding insulating materials in the trenches, setting back the insulating materials at least in a plane direction,
    forming second films used as floating gates between side walls of the insulating materials without making directly contact with the side walls of the insulating materials, and
    setting back the insulating materials from spaces formed between the insulating materials and the second films.

6. The method according to claim 5, wherein the insulating material is set back in a depth direction and the space is formed to extend from a portion between the insulating material and the second film to a portion between the insulating material and the first film.

7. The method according to claim 6, wherein the insulating material is set back in a depth direction and the space is formed to extend from a portion between the insulating material and the second film to a portion between the insulating material and the first film.

* * * * *